United States Patent
Park

(10) Patent No.: US 11,996,669 B2
(45) Date of Patent: May 28, 2024

(54) METHOD AND APPARATUS FOR MATCHING IMPEDANCE OF OPTICAL COMPONENTS USING A TAPERED TRANSMISSION LINE

(71) Applicant: OE Solutions America, Inc., Ridgefield Park, NJ (US)

(72) Inventor: Moon Soo Park, Irvine, CA (US)

(73) Assignee: OE Solutions America, Inc., Ridgefield Park, NJ (US)

( * ) Notice: Subject to any disclaimer, the term of this patent is extended or adjusted under 35 U.S.C. 154(b) by 770 days.

(21) Appl. No.: 17/003,984

(22) Filed: Aug. 26, 2020

(65) Prior Publication Data

US 2021/0066878 A1 Mar. 4, 2021

Related U.S. Application Data

(60) Provisional application No. 62/892,027, filed on Aug. 27, 2019.

(51) Int. Cl.
| | |
|---|---|
| H04B 10/50 | (2013.01) |
| F21V 8/00 | (2006.01) |
| H01S 3/063 | (2006.01) |
| H01S 5/026 | (2006.01) |
| H01S 5/0683 | (2006.01) |
| H03H 7/40 | (2006.01) |
| H01S 5/042 | (2006.01) |

(52) U.S. Cl.
CPC ............ *H01S 3/063* (2013.01); *G02B 6/0046* (2013.01); *H01S 5/0261* (2013.01); *H01S 5/06832* (2013.01); *H03H 7/40* (2013.01); *H04B 10/504* (2013.01); *H01S 5/0427* (2013.01)

(58) Field of Classification Search
CPC ............................ H04B 10/504; H01S 5/0261
See application file for complete search history.

(56) References Cited

U.S. PATENT DOCUMENTS

| | | | | |
|---|---|---|---|---|
| 6,567,439 B1* | 5/2003 | Auracher | ............ | H01S 5/02253 372/36 |
| 7,433,602 B2* | 10/2008 | Diaz | .................... | H04B 10/504 398/141 |

(Continued)

OTHER PUBLICATIONS

R. W. Klopfenstein, "A Transmission Line Taper of Improved Design," Proceedings of the IRE, Jan. 1956, pp. 5.

*Primary Examiner* — Michael Carter
(74) *Attorney, Agent, or Firm* — Ichthus International Law PLLC

(57) ABSTRACT

A method and apparatus for matching different impedance of optical components and a package for optical communication using a tapered transmission line (or a taper) are provided. The taper may be configured to include a first section, a second section, and a third section, each of which corresponds to different components. By way of example, the first section of the taper may be configured to be allocated to a driver to a flex joint on a printed circuit board (PCB), the second section of the taper may be configured to be allocated to a flex circuit, and the third section of the taper may be configured to be allocated to a transistor outline (TO) and submount including a directly modulated laser (DML). The taper is configured to minimize an amount of impedance mismatch between the optical components and the package.

5 Claims, 20 Drawing Sheets

(56) References Cited

U.S. PATENT DOCUMENTS

| | | | |
|---|---|---|---|
| 2018/0067341 A1* | 3/2018 | Kanazawa | H01S 5/0265 |
| 2021/0028597 A1* | 1/2021 | Abdelhalim | H03M 1/742 |
| 2021/0226413 A1* | 7/2021 | Yi | H01S 5/02212 |

* cited by examiner

1. Substrate thickness: 200um
2. Gold thickness: 2um
3. Substrate material: Alumina 99.8%
4. Dielectric constant, Er: 9.8
5. Input parameters
   - Z1: 10 Ohm, Z2: 25 Ohm,
   - Fmin: 5GHz,
   - passband reflection: -20 dB
6. Output results:
   - Taper length: 7.65mm,
   - steps: 21, 1. Substrate thickness: 150um
2. Gold thickness: 2um
3. Substrate material: Alumina 99.8%
4. Dielectric constant, Er: 9.8
5. Input parameters
   - Z1: 13 Ohm, Z2: 25 Ohm,
   - Fmin: 5GHz,
   - passband reflection: -20 dB
6. Output results:
   - Taper length: 6.61mm,
   - steps: 21,

METHOD AND APPARATUS FOR MATCHING IMPEDANCE OF OPTICAL COMPONENTS USING A TAPERED TRANSMISSION LINE

TECHNICAL FIELD

The present disclosure relates to design and implementation techniques for matching impedance of optical components, for example, by a means of a tapered transmission line in an optical device or equipment, and, in particular, to the methods and techniques for matching different impedance values of a directly modulated laser (DML) and a package using a tapered transmission line.

BACKGROUND

A common problem relating to development of an optical sub-assembly (OSA) is an impedance mismatch between test equipment and device under test (DUT). At present, there are several instances of impedance mismatch. For example, there is an instance of impedance mismatch relating to a directly modulated laser (DML) and other components. DML is usually a distributed feedback (DFB) laser or Fabry-Perot (FP) laser having its inherent impedance of about 10 Ohms. One of the components inside is a transmitter optical sub-assembly (TOSA) which is responsible for converting an electrical signal into an optical signal and then transmitting it over an optical fiber channel. Further, DML transmitter circuit is typically designed to have an impedance of 25 Ohm and thus the TOSA package has an impedance of 25 Ohm. As such, there rises an instance of impedance mismatch and in order to address the issue, a matching resistance can be added in series with the DML to make 25 Ohm to match the impedance. Also, the DML may be mounted on a submount and packaged in a TOSA package having an impedance of 25 Ohm and the TOSA package is electrically connected to a printed circuit board assembly through flexible circuit. In this case, there will be a significant impedance mismatch between the DML and peripheral devices such as the submount, TOSA package and flexible circuit, thereby causing design issues and degrading the performance of the system.

By way of example, when a DML TOSA is a 25 Ohm based design, many test engineers run into having difficulty in characterizing the performance of the DML, chip on carrier (CoC) of DML or packaged DML TOSA. When a DML CoC or a DML TOSA is measured, the test engineers use an impedance conversion function provided by the light wave component analyzer (LCA) which has an impedance of 50 Ohm. However, to use the impedance conversion function correctly, a test board typically needs to be calibrated accurately. Further, there are several options for developing an evaluation board for the DML TOSA because of issues such as where an interface point between 50 Ohm and 25 Ohm will be located and how the impedance can be calibrated to the interface point, etc. which are often troublesome to many test engineers.

Further, as for DML chip characterization such as S-parameters, DML chips are usually mounted on CoCs and thus the characterization can be done relatively accurately using the impedance conversion function of LCA with a proper calibration. However, when a DML TOSA sample is to be provided to a customer, the issue may become a complicated one since the test equipment of the customer will typically have an impedance of 50 Ohm and the measurement will be done with the 50 Ohm system without the proper calibration. As a result, when the customers do not have well calibrated evaluation boards, it will be difficult for the customers to accurately measure the TOSA performance. In addition, the same issue may occur when the customers try to see the optical performance with a pulse pattern generator (PPG) which has an impedance of 50 Ohm.

Furthermore, in the case of a Mach-Zehnder Modulator (MZM) design, MZM is usually packaged in a package having an impedance value of 50 Ohm, but a typical InP based MZM chip may have an impedance of in the range of 20 Ohm to 40 Ohm, thereby creating an impedance mismatch. As a result, the submount needs to have an impedance of 50 Ohm and besides the termination also has to have a typical impedance of 50 Ohm. Thus, for the characterization of an MZM chip, the same testing issue may arise as with the DML characterization. Accordingly, the CoC has lines of 50 Ohm and when testing the MZM chip mounted on a CoC, it also has a calibration issue as DML TOSA has because the submount has an impedance value of 50 Ohm. In some other cases, some engineers may try to drive an EML TOSA having 50 Ohm with a driver IC of 25 Ohm or to drive a 50 Ohm driver IC with a TOSA having 25 Ohm. These examples are, however, rare cases although this kind of trial efforts may be tried in various implementations of transceivers.

Thus, there are still prominent issues of impedance mismatch in the design of optical components and transceiver implementation. As such, there still is a need for enhanced techniques for resolving an apparent impedance discrepancy between the optical components that are to be assembled in the package.

SUMMARY

In the existing technology there is a need for addressing the impedance matching issues. For example, effective matching of different impedance values will resolve a lot of difficulties involved in the testing of optical components, such as directly modulated laser (DML) lasers, Mach-Zehnder Modulators (MZMs), etc. and will also address issues encountered in the implementation of evaluation boards of various optical components such as DML transmitter optical subassembly (TOSA) and/or MZM TOSA.

Nowadays, all directly modulated lasers (DMLs) in a transistor outline (TO) package are assembled in 25 Ohm headers or TO headers of 25 Ohm. The impedance of all commercially available DML driver integrated circuit (IC) is about 25 Ohm. As such, in the existing technology, the impedance from the driver IC to an input of TO pin plus submount is always matched to 25 Ohm, even though the actual impedance of DML is about 10 Ohm. Also, it is noted that when the impedance of the DML driver IC is about 25 Ohm (single ended) and the DML impedance is about 10 Ohm, it leads to S-parameter S11 (reflection coefficient or return loss) of about −7.3 dB, which may be improved by using various aspects of the present technology.

In an aspect of the present disclosure, a system, technique or method of matching the impedance of a directly modulated laser (DML) using a tapered transmission line is provided. By way of example, the taper transmission line or taper is configured to include a first section, a second section, and a third section. The first section of the taper is configured to be allocated to a driver to a flex joint on a printed circuit board (PCB) or a printed wire board (PWB), the second section of the taper is configured to be allocated to a flex circuit, and the third section of the taper is configured to be allocated to a TO and submount including the DML. Further, in an aspect of the present disclosure, the impedance of TO package is modified in order to obtain an accurate taper design since the impedance of TO package is also a part of a taper.

In an aspect of the present disclosure, the DML is enclosed in a package which may be a TO, a ceramic box, a Consortium on board optics (COBO), or a chip on board (COB) package.

In an aspect of the present disclosure, the first section of the taper is configured to correspond to the TO and internal submount.

In another aspect of the present disclosure, the first section of the taper includes first three segments, the second section includes second fifteen segments, and the third section includes third three segments.

In another aspect of the present disclosure, the first section and the third section are relatively short and the impedance values of the first section and the third section may be approximated as average values of three segments, respectively, and sometimes, at the cost of a slight performance degradation.

In another aspect of the present disclosure, an optical communication device or equipment is provided such that the optical communication device or equipment may include a DML disposed in a package, a DML driver IC, and a taper disposed between the DML and a DML driver IC. The taper is configured to match different impedance of the DML driver IC, the DML, and/or the package.

In another aspect of the present disclosure, the impedance of the DML may be about 10 Ohm and the impedance of the DML driver IC may be about 25 Ohm.

In another aspect of the present disclosure, the taper of the optical communication device or equipment may include a first section, a second section, and a third section. The first section is allocated to a driver to a flex joint on a PCB or PWB, the second section is allocated to a flex circuit, and the third section is allocated to the TO and submount.

In another aspect of the present disclosure, the first section of the taper in the optical communication device or equipment includes a first set of three segments, the second section of the taper includes a second set of fifteen segments, and the third section of the taper includes a third set of three segments.

In another aspect of the present disclosure, the impedance of the first section and the third section of the taper in the optical communication device or equipment are approximated as average values of three segments, respectively, and sometimes at the cost of a slight performance degradation.

In another aspect of the present technology, an optical communication equipment is provided. The optical communication equipment is configured to include a package with a first impedance, an optical component with a second impedance, and a taper coupled to the optical component and the package. The taper coupled to the optical component and the package is configured to minimize an amount of an impedance mismatch between the first impedance and the second impedance.

In another aspect of the present disclosure, the optical component of the optical communication equipment may be enclosed in the package. Alternatively, part of the optical component of the optical communication equipment may be outside the package.

In another aspect of the present disclosure, the optical communication equipment may include as the optical component a directly modulated laser, a Mach-Zehnder Modulator laser, or a vertical cavity surface emitting laser.

In another aspect of the present disclosure, the taper of the optical communication equipment may be designed to match an impedance of the optical component with an impedance of the package.

In another aspect of the present disclosure, the package may be of a TO, a ceramic box, a COBO, or a COB package.

In another aspect of the present disclosure, the taper of the optical communication equipment is designed to match the second impedance of the optical component with the first impedance of the package.

As such, the implementation of one or more aspects of the present technology may provide numerous benefits as a result of impedance matching over the existing technology, including lower driving voltage and less power consumption, less reflection, less radio frequency radiation, etc.

BRIEF DESCRIPTION OF THE DRAWINGS

These and other features, aspects and advantages of the present disclosure will become better understood from the following description, appended claims, and accompanying figures where:

DETAILED DESCRIPTION OF EMBODIMENT(S)

Figure 1:
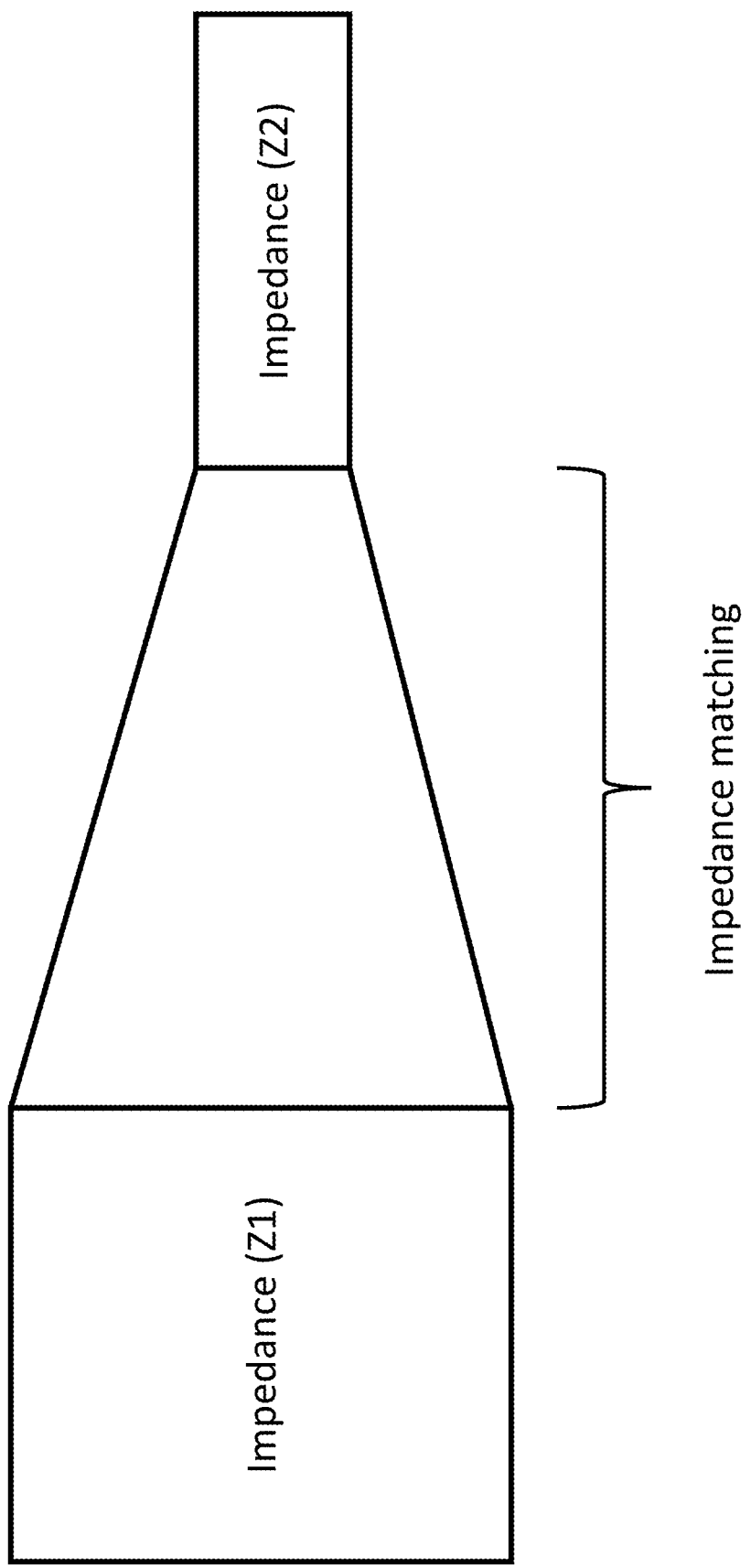
FIG. 1 is a diagram conceptually illustrating an embodiment of the present disclosure.

The detailed description of illustrative examples will now be set forth below in connection with the various drawings. The description below is intended to be exemplary and in no way limit the scope of the present technology. It provides a detailed example of possible implementation and is not intended to represent the only configuration in which the concepts described herein may be practiced. As such, the detailed description includes specific details for the purpose of providing a thorough understanding of various concepts, and it is noted that these concepts may be practiced without these specific details. In some instances, well known structures and components are shown in block diagram form in order to avoid obscuring such concepts. It is noted that like reference numerals are used in the drawings to denote like elements and features.

Further, methods and devices that implement example embodiments of various features of the present technology are described herein. Reference in the description herein to "one embodiment" or "an embodiment" is intended to indicate that a particular feature, structure, or characteristic described in connection with the example embodiments is included in at least an embodiment of the present technology or disclosure. The phrases "in one embodiment" or "an embodiment" or "an example embodiment" in various places in the description herein are not necessarily all referring to the same embodiment.

In the following description, specific details are given to provide a thorough understanding of the example embodiments. However, it will be understood by one of ordinary skill in the art that the example embodiments may be practiced without these specific details. Well-known circuits, structures and techniques may not be shown in detail in order not to obscure the example embodiments (e.g., circuits in block diagrams, interconnects, etc.).

Further, the term "transistor outline (TO)" as used herein shall mean an industrial standard that governs the design and size of current conducting microelectronic packaging and housing as the ordinary and customary meaning used in the optical industry. A typical TO package may consist of two components: a TO header and a TO cap. The TO header is configured to provide that encapsulated components are provided with power, and the TO cap is configured to ensure the smooth transmission of optical signals, including optical transmitters, e.g., laser diodes, and optical receivers, e.g., photodiodes.

Further, although the example embodiment herein describes various aspects of the present technology in reference to the standard design and size of a TO package, application of the present technology is not limited thereto and may be applied to other designs, sizes and types of a package. By way of example, the package may be of a TO, a ceramic box, a Consortium on board optics (COBO), a chip on board (COB) package or any other package type.

In the present disclosure, the term "DML" as used herein shall refer to a directly modulated laser or a directly modulated laser diode and/or a directly modulated vertical cavity surface emitting laser (VCSEL). Generally, directly modulated lasers (DMLs) offer cost effective transmitters compared to externally modulated lasers (EMLs) which use continuous wave lasers and followed by electro-absorption modulators (EAMs). The advantages of DMLs are their simplicity over the EMLs and as such various embodiments of the present technology are presented for illustration purposes using the DMLs. However, the application of the present technology disclosed herein is not limited thereto.

Further, sometimes, the DML is also called a distributed feedback (DFB) laser due to its structure, in which a single chip is used with a simple electrical circuit for a small footprint and low power consumption. It places information on the optical beam by modulating an on/off electrical input generated by a driver Integrated Circuit (IC), which is directly applied to the laser diode that generates a modulated optical signal output. As such, the general applications of DMLs are for lower data rate applications and shorter distances.

Furthermore, even though the impedance of DML is assumed to be a pure resistance, its impedance is a complex impedance of about 10 Ohm. It is also noted that adding a small resistance will reduce an effect of the complex impedance of DML. And the addition of the small resistance will also slightly increase load impedance and give a better impedance matching and overall performance. As such, slightly reduced source impedance and slightly increased load impedance may also help achieving a better impedance matching.

In an aspect of the present disclosure, for a better understanding of impedance matching, a brief description of impedance matching of two impedances Z1 and Z2 is provided herein as shown in FIG. 1. Using a tapered transmission line in a specific frequency range, the two impedances Z1 and Z2 may be matched. The impedance mismatch or impedance conversion is a traditional issue in the radio frequency (RF) and microwave applications. By way of example, a RF system may be a 50 Ohm based system and a Yagi-antenna may have an impedance value of about 73 Ohm. Thus, this example of FIG. 1 provides one of traditional issues of impedance mismatch. One general methodology for handling such impedance mismatch may be described in an article published in 1956 by R. W. Klopfenstein, titled "A Transmission Line Taper of Improved Design," Proceedings of the IRE, pages 31-35, January 1956, the content of which is incorporated by reference herein in its entirety. It is also noted that using tapered lines impedance matching networks can be implemented in various techniques and the present technology is not limited to the embodiments described in the current disclosure. That is, using various techniques, impedance matching networks may be designed with continuous tapers or tapered transmission lines.

However, there has been no application of the methodology or a similar methodology or technique in the area of optical communications, in particular, in the design of various optical components including transmitter optical sub-assemblies (TOSAs), receiver optical sub-assembly (ROSAs), and other optical transceivers in different packages. The present disclosure provides various techniques or applications of methodologies of matching impedance using tapered transmission lines, in particular, in the design of TOSAs and optical transceivers. However, the application of the present disclosure is not limited thereto.

In an aspect of the present disclosure, a taper transmission line is used to reduce impedance mismatch in the design of optical device or equipment. For example, using a tapered transmission line in the design of optical devices may render several application areas possible. By way of example, in one or more aspects of the present disclosure, an impedance converter using the tapered transmission line (or the taper) may be applied to, among others, the following cases: (i)

characterization of a 25 Ohm based TOSA using test equipment having an impedance of 50 Ohm, (ii) impedance matching of a DML TOSA between a submount/TOSA package and a DML chip of having an impedance of 10 Ohm, (iii) impedance matching between a driver IC of 25 Ohm and TOSA of 50 Ohm, (iv) impedance matching between a driver IC of 50 Ohm and TOSA of 25 Ohm, (v) impedance matching between a driver IC of 50 Ohm and a Mach-Zehnder Modulator (MZM) of 20-30 Ohm, (vi) impedance matching in VCSEL design, and many other situations. In the examples disclosed herein, it is also noted that DML has a very low impedance and often leads to an impedance mismatch because of different impedance values between components (e.g., 10 Ohm vs 25 Ohm) as noted above. As such, although, an absorption resistor-capacitor (RC) circuit may be implemented between the transmission line and ground in an attempt to address the impedance mismatch, a tapered transmission line or taper may be used or implemented to match the different impedance values in a different type of a package such as a ceramic box, a TO, a COBO, or a COB package.

Figure 2A:
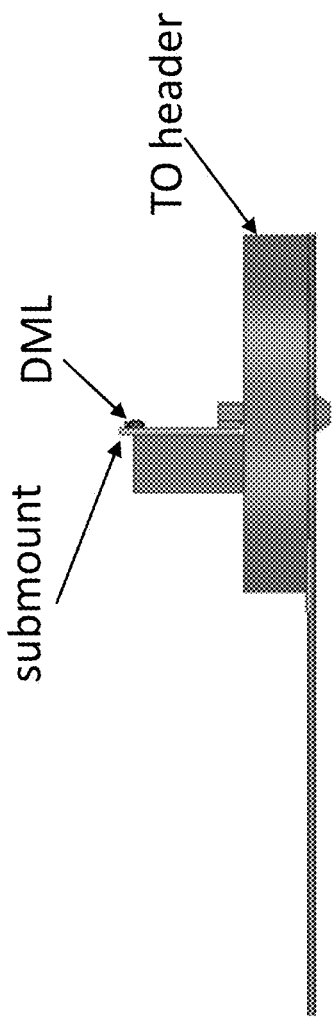
FIGS. 2A, 2B and 2C are diagrams illustrating perspective views of an example embodiment in an aspect of the present disclosure.
Figure 2B:
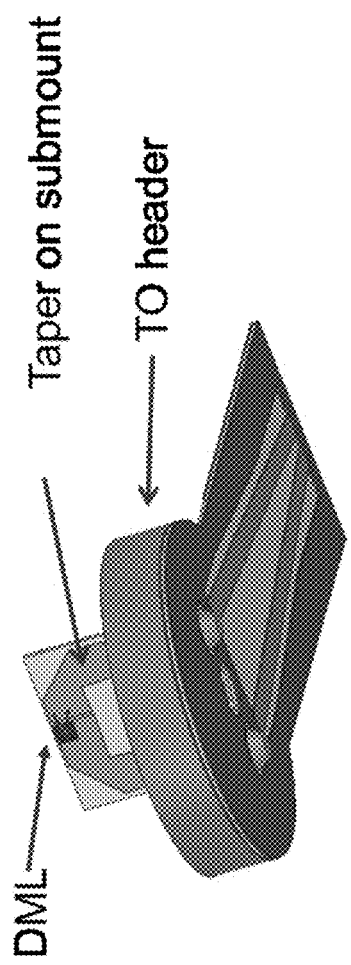
Figure 2C:
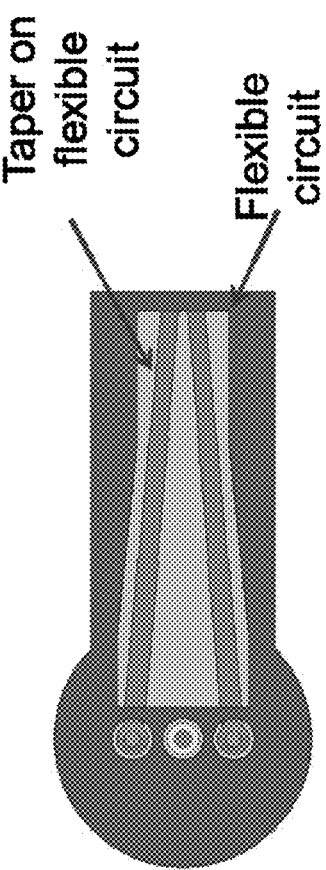

As an initial matter, an impedance matching over a very wide bandwidth may be implemented using a tapered transmission line as shown in FIGS. 2A-2C. FIG. 2A through FIG. 2C show different perspective views of an example embodiment of the present technology. FIGS. 2A-2C are different perspective views of an example embodiment of a TO type TOSA. FIG. 2A is a side view of the example embodiment in accordance with an aspect of the present disclosure. In the example, a DML is disposed on a submount in a TO. FIG. 2B is a bottom perspective view of the example embodiment showing an example taper disposed on the submount in accordance with an aspect of the present disclosure. FIG. 2C is a bottom view of the example embodiment showing the taper disposed on a flexible circuit in accordance with an aspect of the present disclosure. Further, in an aspect of the present disclosure, although the taper in the example of FIGS. 2A-2C is shown to be located on the submount and flex circuit, the location of the taper may not be limited thereto, and thus the taper may be disposed at any location between the DML, and the DML, driver IC.

Figure 2D:
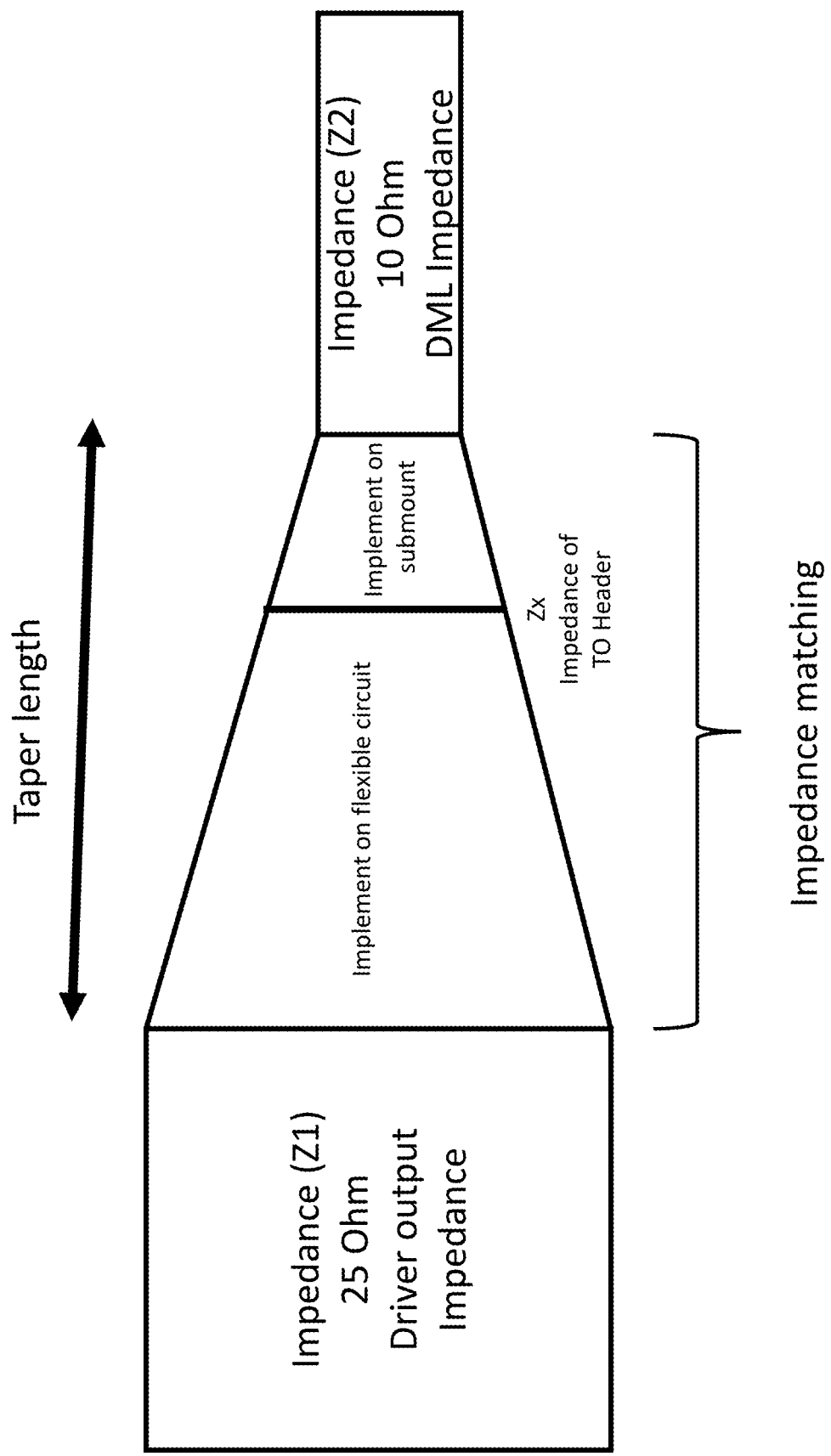
FIG. 2D is a diagram conceptually illustrating impedance matching of an example embodiment in an aspect of the present disclosure.

FIG. 2D is a diagram conceptually illustrating another example embodiment of the present technology. In the example, a tapered transmission line (or a taper) is designed or implement the impedance matching between the driver output impedance of 25 Ohm (Z1) and the DML impedance of 10 Ohm (Z2). In the example, the matching impedance of the taper may be implemented via two separate impedance or implementations, for example, a first part of the taper for flexible circuit and a second part of the taper for submount, which are divided at the Zx impedance of TO Header. Alternatively, as mentioned above, the matching impedance may be implemented in a single taper.

Figure 2E:
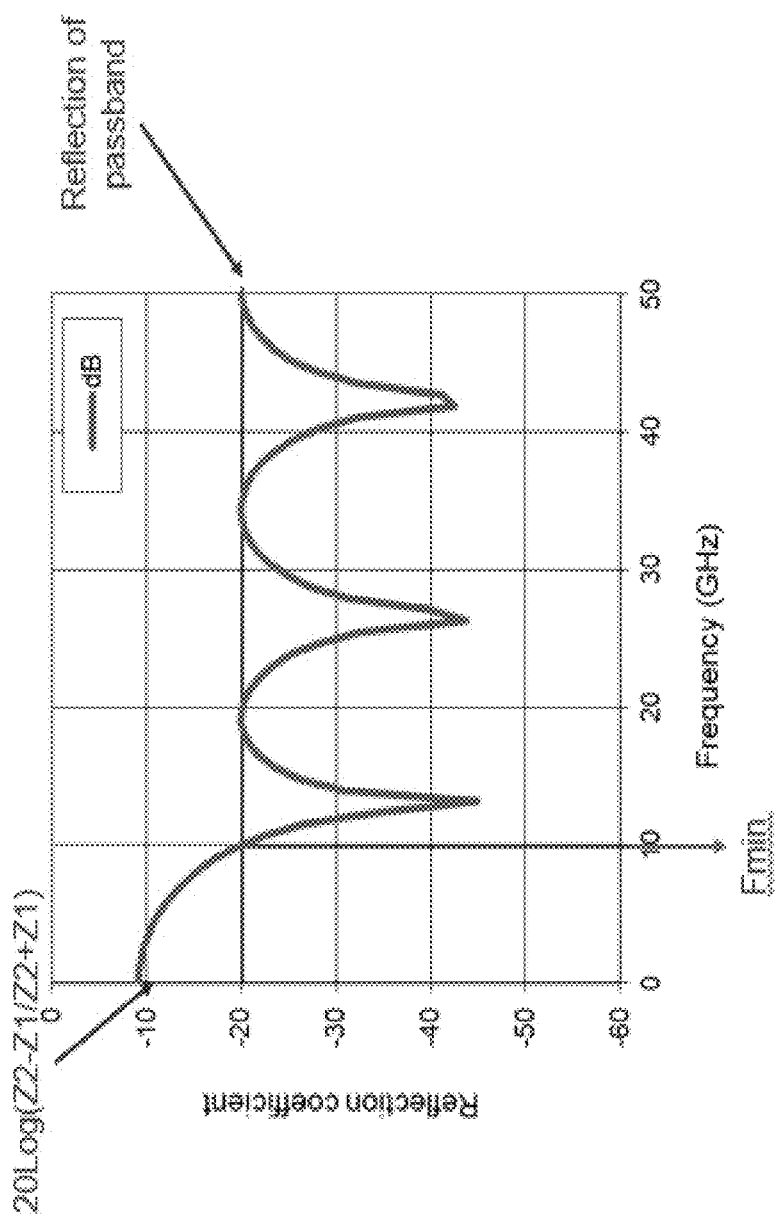
FIG. 2E is a reflection coefficient response of an example embodiment in an aspect of the present disclosure.

FIG. 2E illustrates a diagram conceptually illustrating an impedance matching of the embodiment in accordance with one or more aspects of the present disclosure. FIG. 2E shows a reflection response, e.g., a reflection coefficient response, of the tapered transmission line over a frequency bandwidth of GHz. As shown in FIG. 2D, the reflection at above 10 GHz (e.g., $F_{min}$) is maintained below −20 dB. That is, in the example, the reflection of a passband is about −20 dB using a taper design including a tapered transmission line in accordance with an aspect of the present disclosure. Further, in the example, the maximum reflection coefficient or S11 value at the zero frequency may be determined by the following: $20*\log((Z2-Z1)/(Z1+Z2))$, where Z1 is the first impedance and Z2 is the second impedance. Furthermore, in the taper design, $F_{min}$ and a maximum reflection above $F_{min}$ may be specified. That is, for a given value of a dielectric material such as a dielectric constant and material thickness, the length of the taper design (or taper) may be determined and/or changed in accordance with the theory of taper design as described in the Klopfenstein paper as noted above, which is incorporated by reference in its entirety. Thus, in one implementation, since $F_{min}$ is at a lower frequency, the length of the taper that is to be designed may be increased based on desired matching characteristics as described below.

For illustration purposes, a design example of an impedance converter (or impedance matching) from 50 Ohm to 25 Ohm is provided herein and is based on the use of a tapered transmission line. It is noted that the conversion of 50 Ohm to 25 Ohm may be important in the design of an evaluation board for the characterization of a DML TOSA of 25 Ohm, in the design of a submount for characterization of Mach-Zehnder Modulator (MZM), and in the design of a printed wiring board (PWB) between a driver IC of 50 Ohm and a DML TOSA of 25 Ohm.

Figure 3:
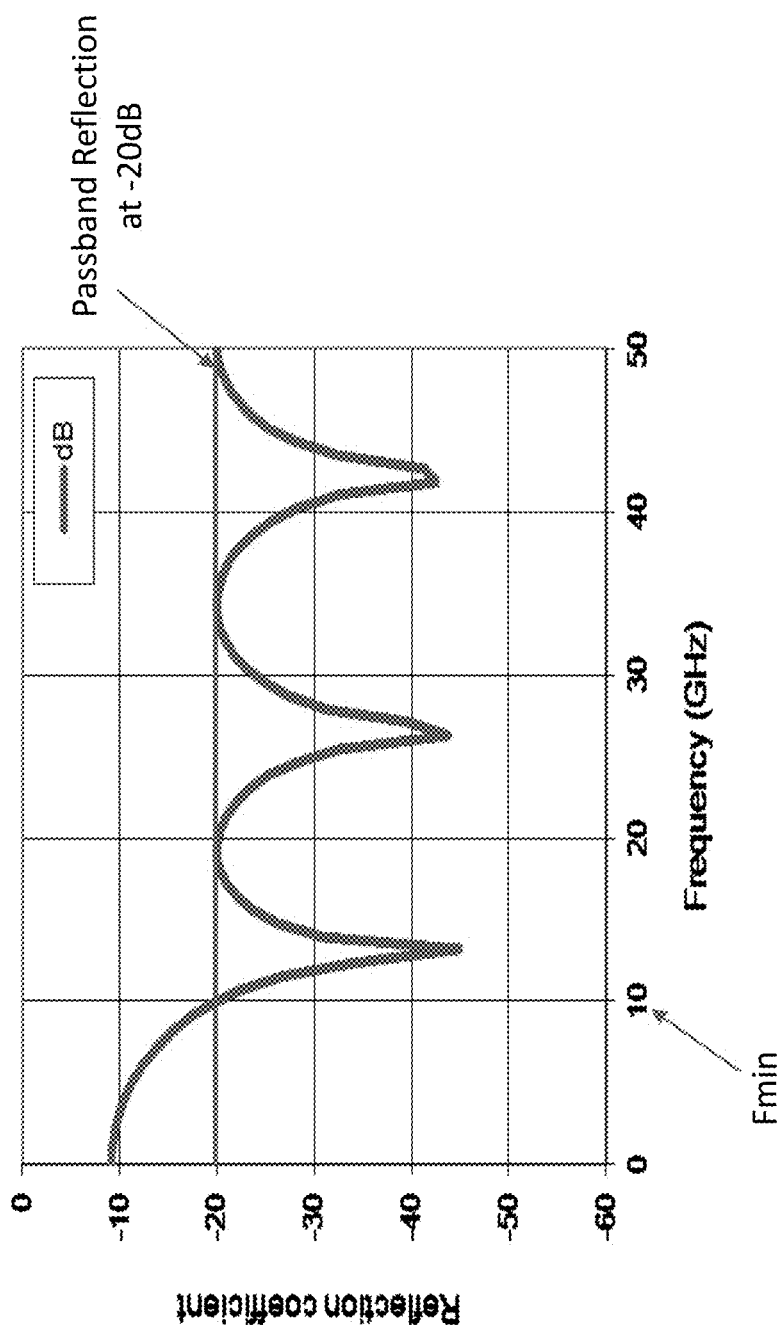
FIG. 3 is a reflection coefficient response of an example embodiment in an aspect of the present disclosure.
Figure 4:
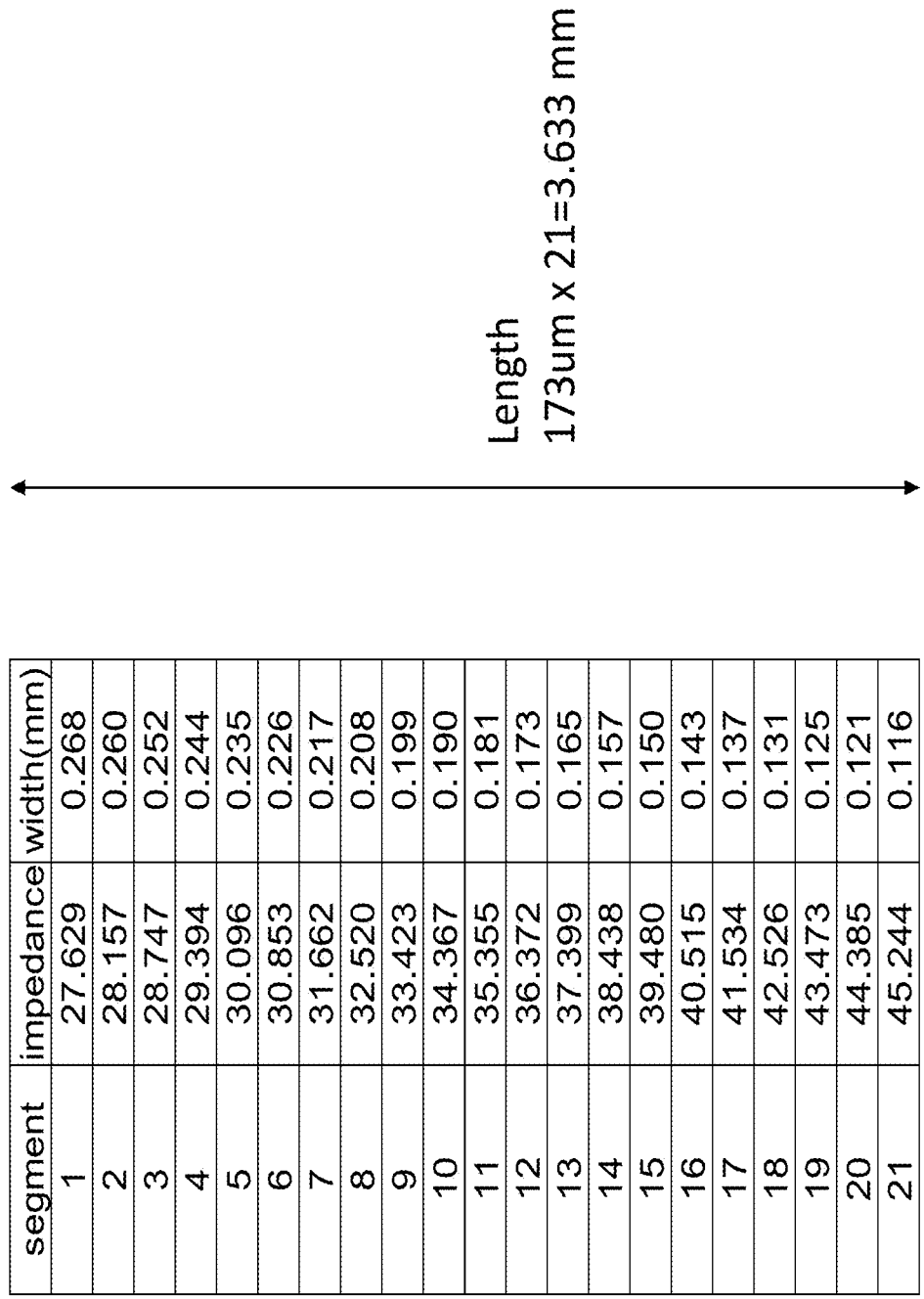
FIG. 4 is an example taper design in an aspect of the present disclosure.
Figure 5A:
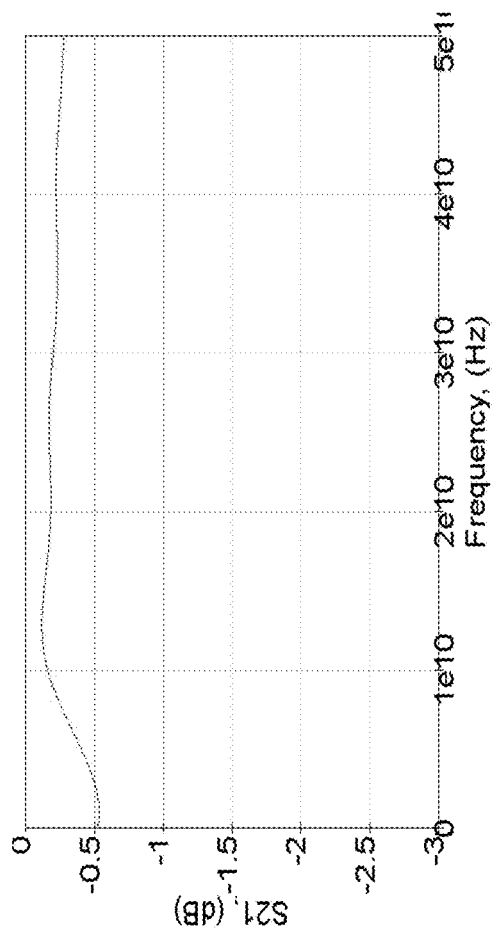
FIGS. 5A and 5B are output responses of an example embodiment in an aspect of the present disclosure.
Figure 5B:
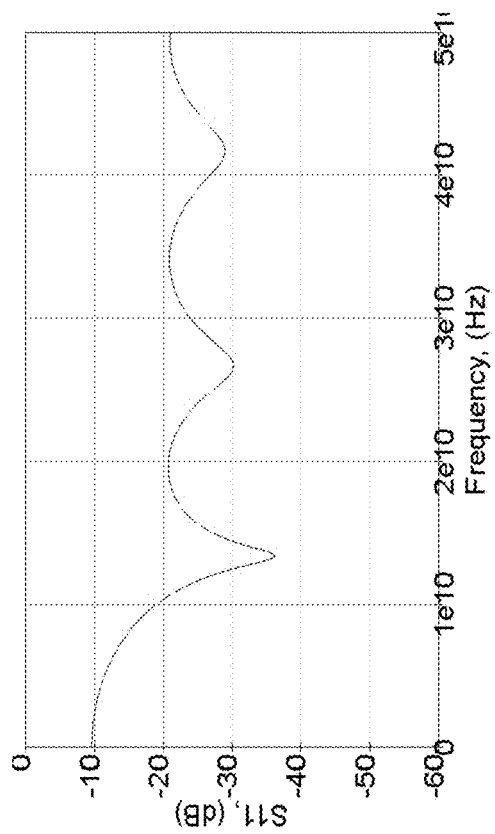

In an aspect of the present disclosure, in one example, there exists a need for matching different impedance between measuring equipment of 50 Ohm (an evaluation board) and a DML TOSA of 25 Ohm. In such a case, one can design a reflection coefficient response as shown in FIG. 3 and implement a taper design as shown in FIG. 4. In the example, the maximum reflection coefficient or S11 value at the zero frequency may be determined by the following: $20*\log((Z2-Z1)/(Z1+Z2))$, where Z1 is 25 Ohm and Z2 is 50 Ohm and thus, the max S11 response at zero frequency is calculated to be −9.54 dB. Further, for these input values, the reflection coefficient response S11 and transfer function response S21 (of the designed taper) over a frequency range are shown in FIG. 5A and FIG. 5B.

Also, in another example, a substrate material having a dielectric constant of 9.8, a substrate thickness of 100 um, and a conductor thickness of 3 um may be used in the example of DML TOSA design. Also, aluminum oxide ($Al_2O_3$) or aluminum nitride (AlN) may be used for the submount design and a tapered transmission line may be implemented to match different impedance values between the driver IC impedance of 50 Ohm and the DML TOSA impedance of 25 Ohm. In the example, the goal of the impedance matching between the two different impedance values may be −20 dB of a reflection coefficient (S11) response at a frequency range above 10 GHz ($F_{min}$) as shown in FIG. 2E and FIG. 3.

In an aspect of the present disclosure, for the implementation of a tapered transmission line, a taper including a microstrip taper may be used for the impedance matching and the designed geometry of the taper may be that a total length of the tapered transmission line may be 3.63 mm including 21 steps of segmented taper sections as shown in FIG. 4. In another implementation, the taper may include a coplanar waveguide or coplanar stripline. In the example, each segment of the tapered transmission line may have a different width size (in mm) but the same length (e.g., 173 um), as well as an impedance value (in Ohm). It is also noted that although specific dimensions of the tapered transmission line or taper are used herein for the purpose of clarity and illustration, the present disclosure of the present technology is not limited thereto and other dimensions in accordance with one or more aspects of the present disclosure may be used.

Referring back to FIGS. 3 and 4, the taper design goal may be to have the maximum value of a reflection coefficient S11 response at higher than 10 GHz ($F_{min}$) is maintained at about −20 dB. As such, it is noted that $F_{min}$ is at 10 GHz and the passband reflection is about −20 dB. Further, it is noted that the reflection coefficient or S11 response at less than 10 GHz is getting bigger as the frequency decreases toward zero frequency. The maximum reflection coefficient S11 response at zero frequency is shown to be about −9.54 dB, as shown in FIG. 3, which is determined by two impedance values, Z1 and Z2 as shown in FIG. 2E. That is, in the example, the maximum reflection coefficient or S11 value at the zero frequency may be determined by the following: 20*log ((Z2−Z1)/(Z1+Z2)), where Z1 is 25 Ohm and Z2 is 50 Ohm and in the example, the max S11 response at zero frequency is calculated to be −9.54 dB.

Further, as mentioned above, for the example design, as shown in FIG. 4, the taper may be designed such that the total length of a needed tapered transmission line is determined to be 3.633 mm with 21 steps and having a length of a step to be 0.173 mm. As can be seen in FIG. 4, segments of the designed taper include varying impedance values and width values. That is, the characteristic impedance of the tapered transmission line may be modified by tapering the width of the transmission line, thereby creating the desired impedance taper by increasing or decreasing the width of the transmission line (the microstrip, stripline, or the like).

Using the design parameters shown in FIG. 3 and FIG. 4, the output simulation results for the example design for impedance matching between 25 Ohm to 50 Ohm may be obtained as shown in FIG. 5A and FIG. 5B, showing the reflection coefficient response S11 and transfer function response S21 (of a designed taper) over a frequency range.

Figures 6A, 6B:
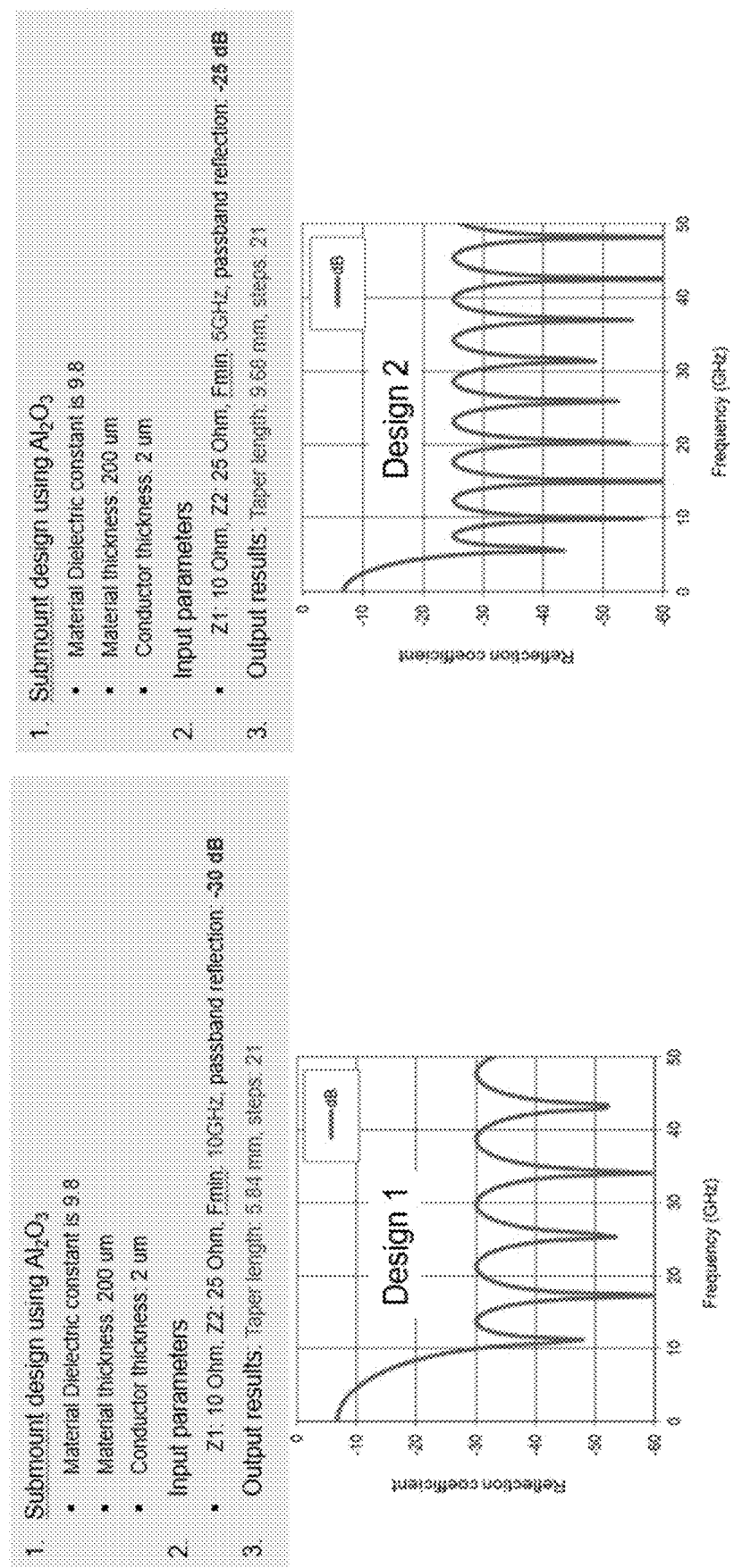
FIGS. 6A and 6B illustrate output responses of example embodiments in an aspect of the present disclosure.

FIG. 6A and FIG. 6B illustrate results of two different designs with different $F_{min}$ values. In another aspect of the present disclosure, the present disclosure provides other example techniques or methodologies for impedance conversion, for example, from 25 Ohm to 10 Ohm. By way of example, multiple designs with different values of $F_{min}$ may be implemented as shown in FIG. 6A and FIG. 6B. FIG. 6A illustrates that the first design with $F_{min}$ of 10 GHz and passband reflection of −30 dB results in an output length of a taper design of 5.84 mm with 21 steps. FIG. 6B illustrates that the second design with $F_{min}$ of 5 GHz and passband reflection of −25 dB results in an output length of a taper design of 9.68 mm with 21 steps.

In an aspect of the present disclosure, for the purposes of illustration, in another example, taper impedance convertors for DFB packaging (e.g., 25 Ohm to 10 Ohm) may be implemented. In the case of DFB TO, the impedance of a TO header is typically about 25 Ohm and the internal submount may be designed with a 25 Ohm transmission line and a DFB chip of 10 Ohm may be mounted on top of the 25 Ohm transmission line. Because an impedance of 10 Ohm is terminated at the end of the 25 Ohm transmission line, the DFB TO design without the present technology may result in poor reflection coefficient S11 and transfer function S21 responses. However, by implementing a tapered transmission line in accordance of one or more aspects of the present disclosure, the reflection coefficient and transfer function responses, S11 and S21, respectively may improve significantly.

Figures 7A, 7B:
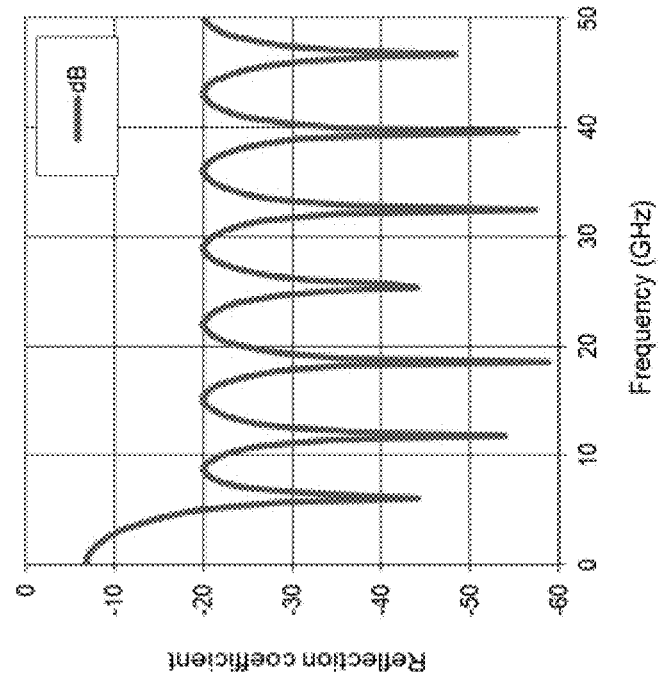
FIGS. 7A and 7B illustrate a reflection coefficient response of an example embodiment in an aspect of the present disclosure.

In another aspect of the present disclosure, in an example design of a taper for a 25 Ohm TOSA package, a taper of 25 Ohm to 10 Ohm may be designed with certain input parameters. By way of example, as shown in FIG. 7A, for the design conditions may be provided as follows: a substrate material is alumina 99.8%, a substrate thickness is 200 um, a gold thickness is 2 um, and a dielectric constant is 9.8, as well as the input parameters may be set as: Z1=10 Ohm, Z2=25 Ohm, $F_{min}$=5 GHz, and passband reflection=−20 dB. For the above design conditions and input parameters, output results for a needed tape design may be obtained as a taper length of 7.65 mm of 21 steps, as shown in FIG. 7A and FIG. 7B.

In the example, however, it is noted that the designed taper length of 7.65 mm may be unrealistic to use for the submount of a DFB TO, because a typical length available in a TO56 for a DFB laser is typically about 1-2 mm, which is much a shorter length than the designed taper length. Thus, the design conditions may have to be changed and the process may need to be reiterated to obtain a more realistic taper design length which fits into the TO56. However, it is also noted that in another aspect of the present disclosure, the initial design length may be applicable and used when a different type of a package, for example, a box type package, which has relatively bigger internal dimensions. Alternatively, a taper design having a smaller taper length may also be obtained with relaxed design specification.

Figures 8A, 8B:
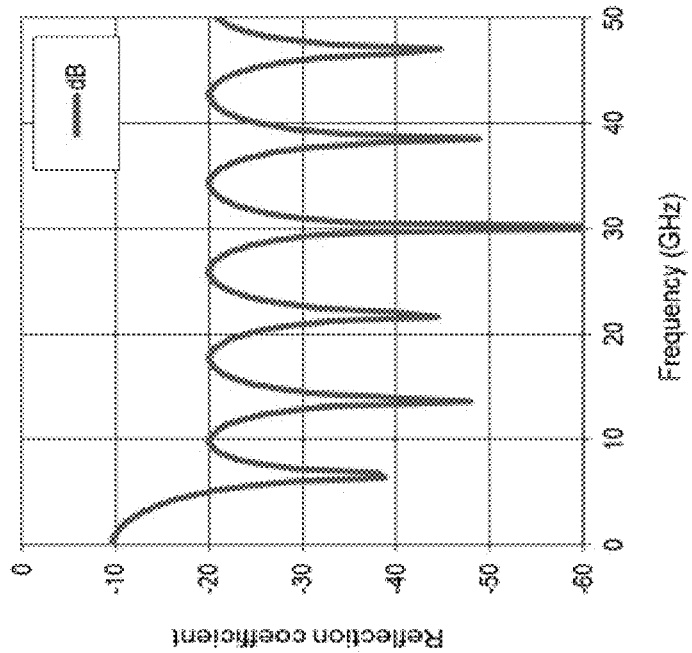
FIGS. 8A and 8B illustrate a reflection coefficient response of an example embodiment in an aspect of the present disclosure.

In another aspect of the present disclosure, the length of the designed taper may be controlled by using a thinner substrate thickness and a larger load impedance. By way of example, in the example, the thickness of the substrate may be changed to 150 um and the load impedance Z1 may be changed to 13 Ohm, thereby resulting in a designed taper length of 6.61 mm with 21 steps, which are illustrated in FIG. 8A and FIG. 8B.

However, it is noted that even with the substrate thickness of 150 um, the design length of the taper (e.g., 6.61 mm) may still be greater than what is desired. As such, the load impedance may be further varied based on trial and error until a desired result is obtained.

As mentioned above, by utilizing a taper design, a better impedance matching in the optical devices or equipment including the DML packaging may be achieved and the improved impedance matching contributes to the improvement of an overall performance. As a result, the overall performance of an optical system, device or equipment may become excellent even with some variations of source impedance, load impedance, printed wiring board (PWB) line impedance, TO/submount impedance, and the like.

In another aspect of the present disclosure, the impedance values of PWB and TO and submount may be fixed to certain values, respectively. Even with some variations of PWB and TO and submount, the overall performance may not be affected as much. Also, a flex circuit may be designed with a modified or simpler taper design, which may be easier to implement.

Figure 9:
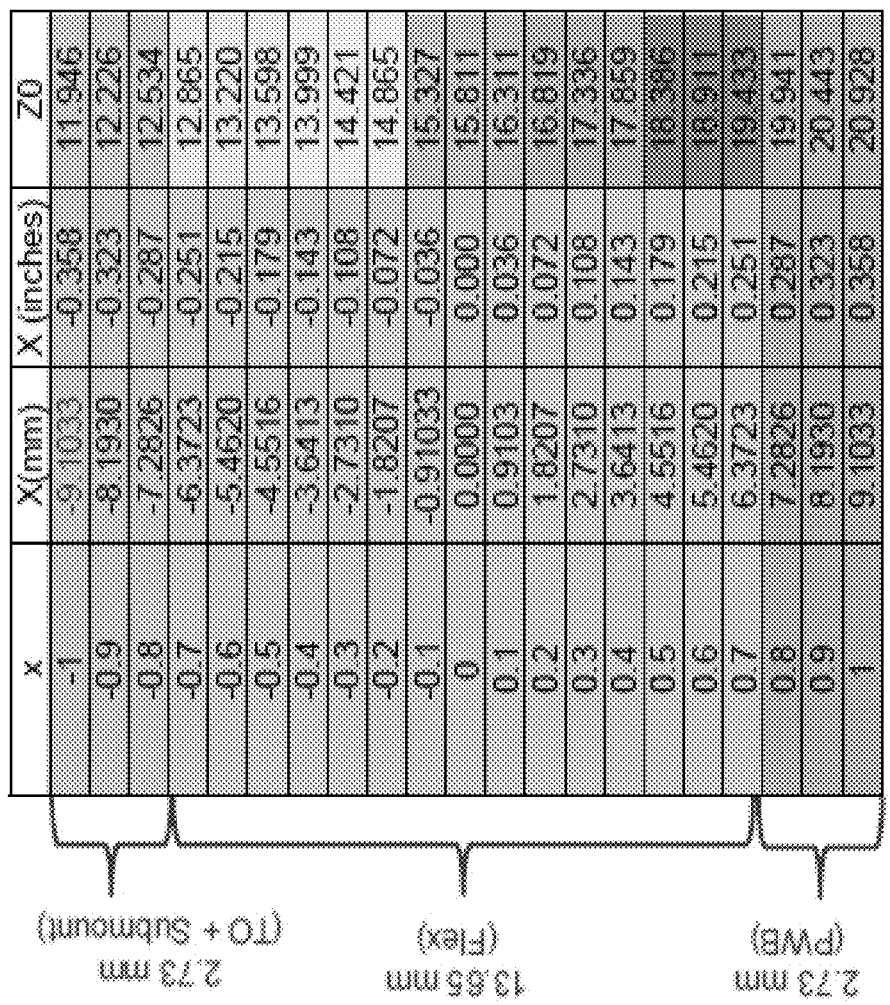
FIG. 9 is another example taper design in an aspect of the present disclosure.

As mentioned above, a taper may be designed and implemented to match the different impedance values, for example, to address the impedance mismatch between 25 Ohm and 10 Ohm. Further, using the certain design requirements, a total length of the taper may be 19 mm, which may be too long to implement in a flex circuit and DML TO, and as a result, it may require many iterations of taper designs as well as modifications of input parameters. Further, the taper that is designed may include multiple sections, for example, three sections, which correspond to different components as shown in FIG. 9. By way of example, the three sections of the taper may include (i) a first section or segment for a driver to a flex joint on a printed circuit board (PCB), (ii) a second section or segment for a flex circuit, and (iii) a third section or segment for TO and submount including DML. Further, the impedance of a TO package has to be modified in order to obtain an accurate taper design since the impedance of the TO package is also a part of the taper.

FIG. 9 illustrates an example taper design in an aspect of the present disclosure. In the example, the first section of the designed taper corresponding to the PCB or PWB has a length of 2.73 mm, the second section of the designed taper corresponding to the flex circuit has a length of 13.65 mm, and a third section of the designed taper corresponding to the TO and submount has a length of 2.73 mm. As such, the designed taper length becomes a total taper length of 19.11 mm, which may be too long to implement it in a flex circuit, and thus may require further design iterations based on different input parameters.

Also, as mentioned above, in the example shown in FIG. 9, the designed taper may include three sections. That is, the designed taper includes a first section corresponding to PWB, a second section corresponding to flex circuit, and a third section corresponding to TO and submount. In the example, the length of the first section is 2.73 mm and the first section includes three segments. The length of the second section is 13.6 mm and the second section includes fifteen segments. The length of the third section is 2.73 mm and the third section includes three segments. Further, in the example, each segment x has a width of X (in mm or inches) and an impedance value of Z0 (in Ohm).

Further, in the example, it is noted that the first section and the third section of the taper are relatively shorter and their impedance may be approximated as average values of the three segments included therein, respectively. Also, as for the flex circuit, the total length of the flex circuit may be 13.65 mm, which may be too long to fit in, and thus may lead to further iterations of the design of a taper length. Also, for the second section, the segments may be grouped into 5 subgroups and each subgroup's average impedance may be used for a new impedance of each subgroup.

Figure 10A:
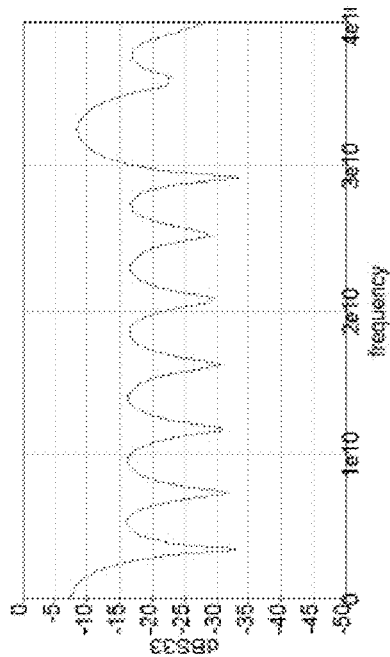
FIGS. 10A, 10B and 10C illustrate output responses of an example embodiment in an aspect of the present disclosure.
Figure 10B:
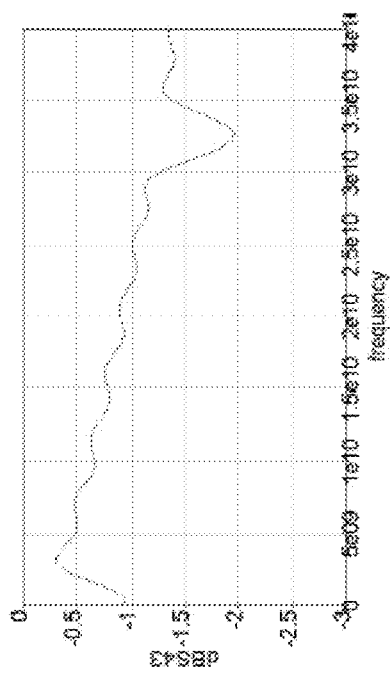
Figure 10C:
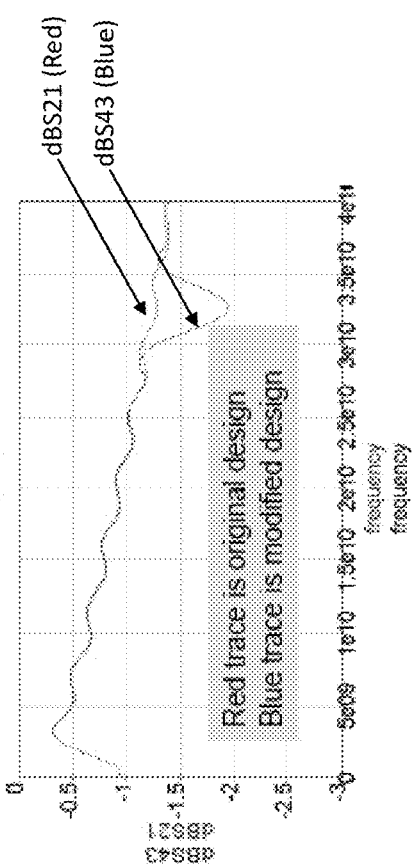

FIG. 10A, FIG. 10B, and FIG. 10C show simulation results of the modified taper design with respect to FIG. 9. It is noted that in the accompanying drawings and figures, wherever applicable, a red trace is intended for an original taper design and a blue trace is intended for a modified taper design.

FIG. 11 and FIG. 12 illustrate optimization results of the modified taper design over the original taper design. In another aspect of the present disclosure, the modified taper design may be further optimized by varying lengths of different sections or segments. By way of example, the length of the flex circuit may be reduced from 2.73 mm to 2 mm of each segment. When the length of the flex circuit is reduced, as shown in FIG. 11 and FIG. 12, S33 (response for modified taper design) response gets worse as the frequency increases, however, S43 response (response for modified taper design) is slightly improved at the expense of S33 degradation, as shown in overlaid graphs.

Figure 11B:
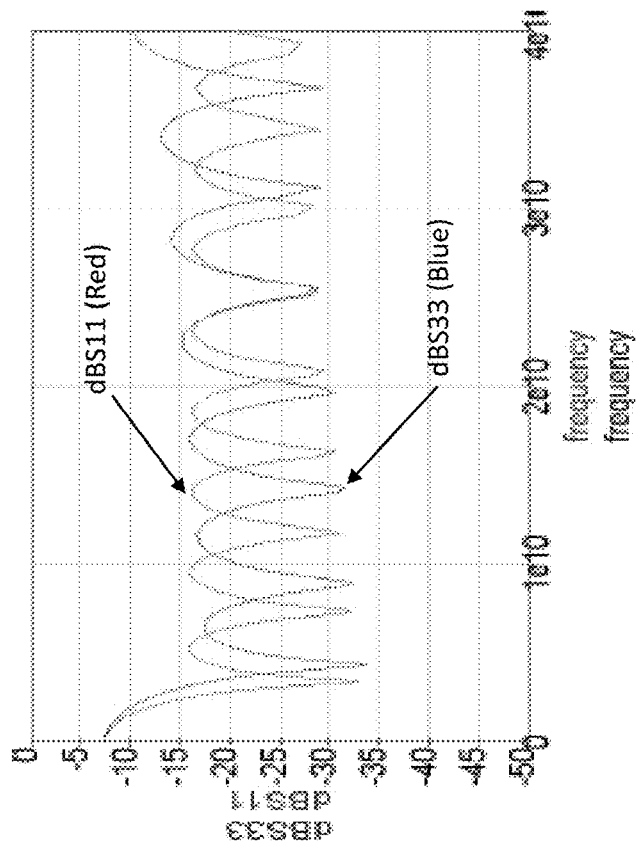
FIGS. 11A and 11B illustrate output responses of an example embodiment in an aspect of the present disclosure.
Figure 11A:
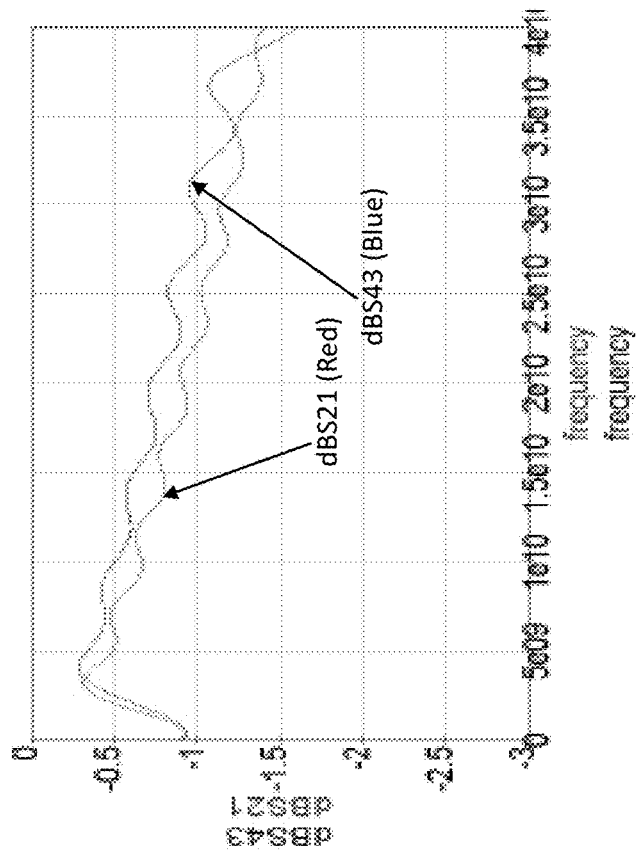
Figure 12B:
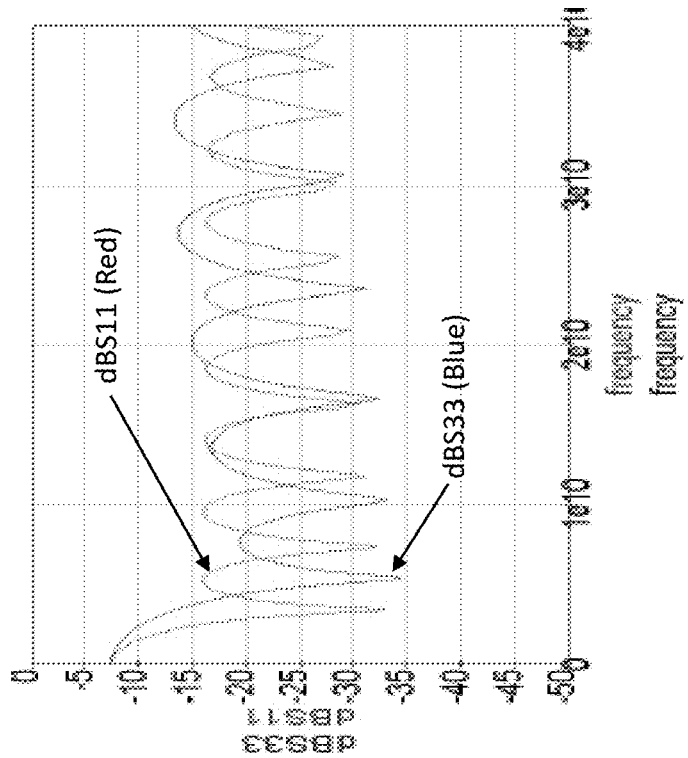
FIGS. 12A and 12B illustrate output responses of an example embodiment in an aspect of the present disclosure.
Figure 12A:
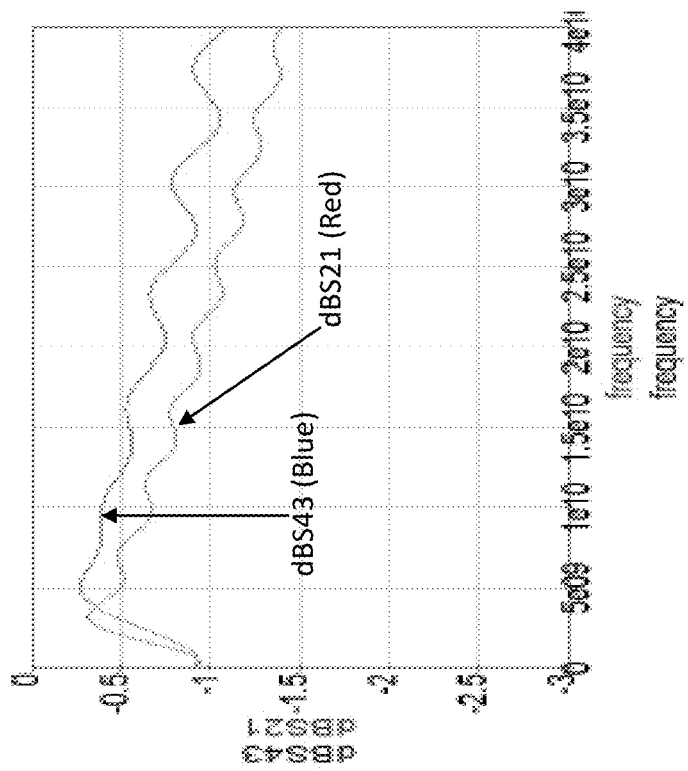

FIGS. 11A and 11B illustrate an optimization result when the length of the flex circuit is reduced from 2.73 mm to 2 mm of each section. FIGS. 12A and 12B illustrate another optimization result when the length of the flex circuit may be reduced from 2.73 mm to 1.5 mm of each section. As shown in FIG. 12A and FIG. 12B, although S33 response gets worse as the frequency increases, S43 response is improved at the expense of S33 response degradation. It is noted that when the length of each section is further reduced to 1.3 mm, S21 improves a bit more at the cost of S11 degradation at high frequencies.

Figure 13B:
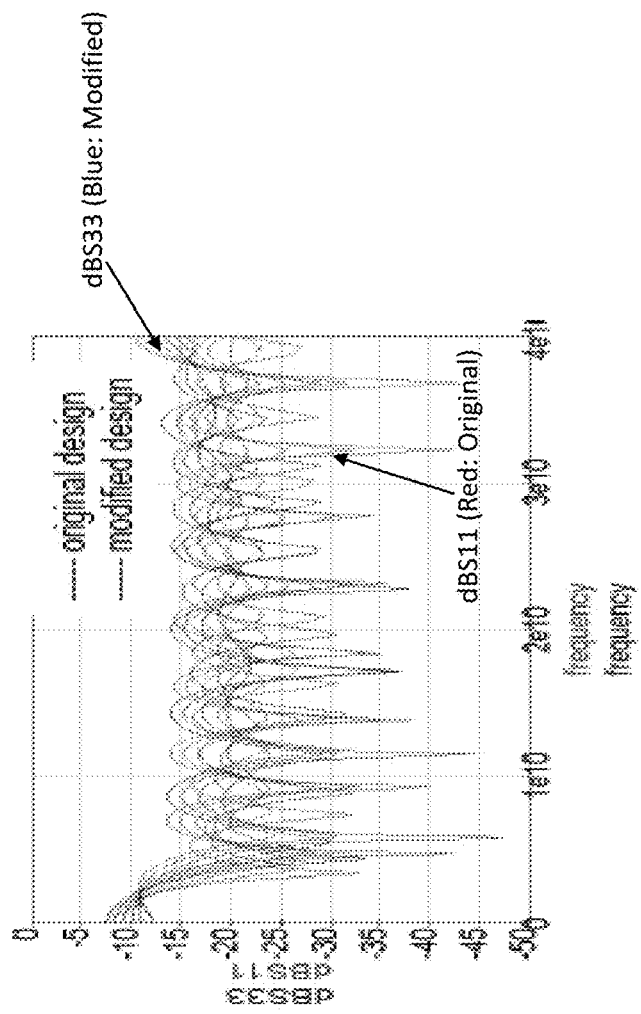
FIGS. 13A and 13B illustrate output responses of an example embodiment in an aspect of the present disclosure.
Figure 13A:
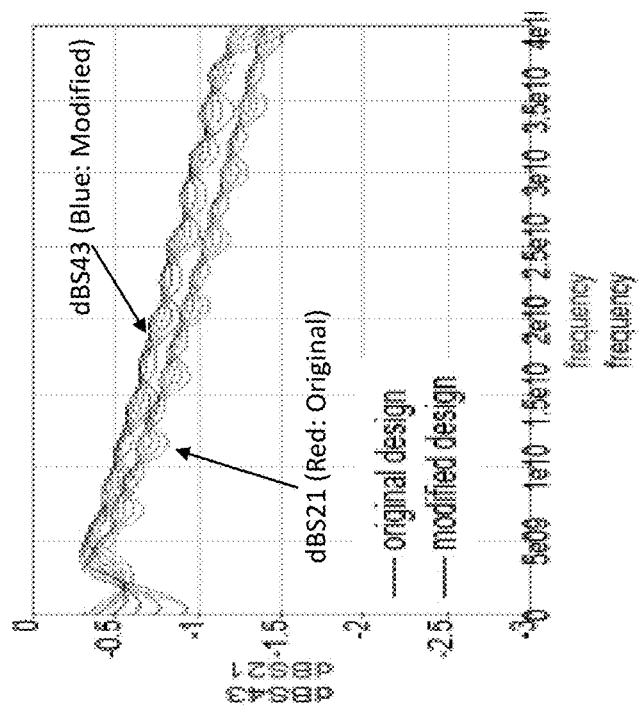

FIG. 13A and FIG. 13B illustrate another optimization result of the modified taper design. In an aspect of the present disclosure, the load impedance may be varied. By way of example, the load impedance may change from 10 Ohm to 15 Ohm and the length of the flex circuit is also reduced from 2.73 mm to 2 mm of each segment.

Figure 14B:
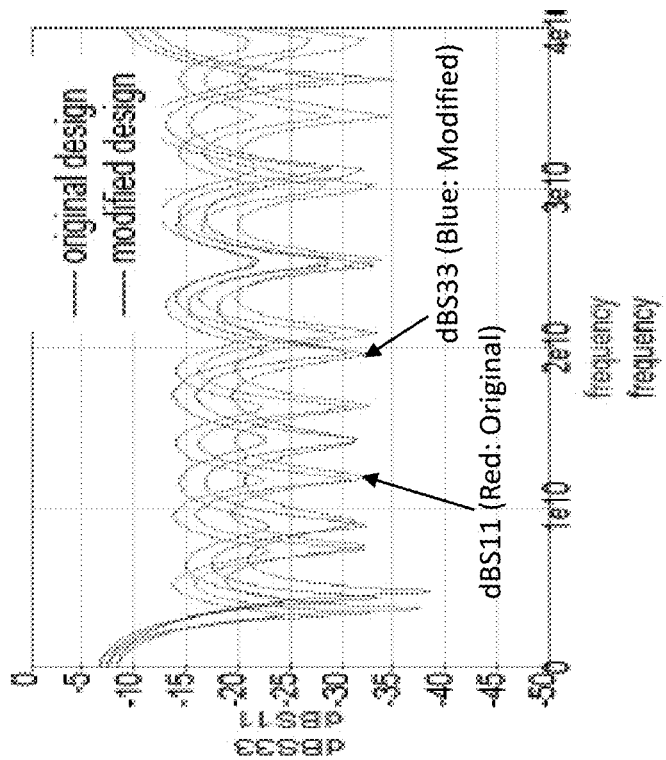
FIGS. 14A and 14B illustrate output responses of an example embodiment in an aspect of the present disclosure.
Figure 14A:
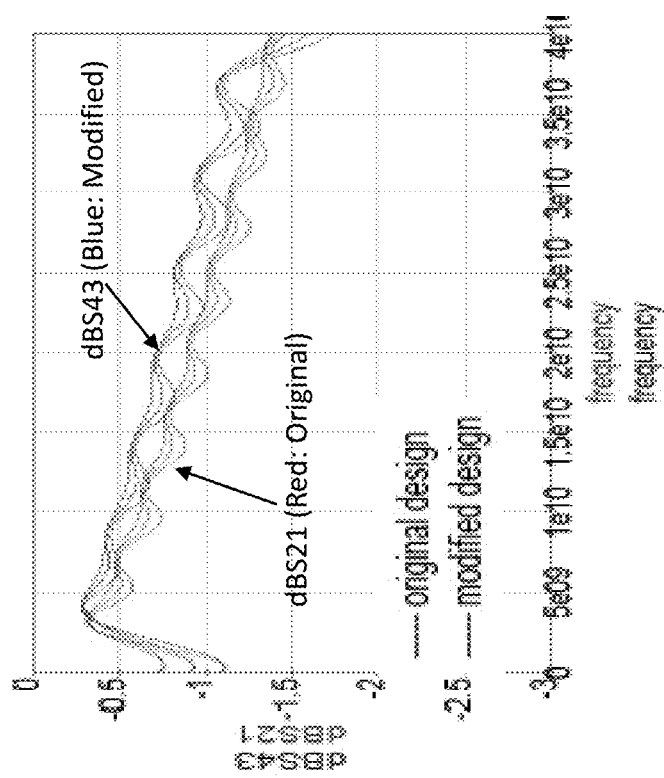

FIG. 14A and FIG. 14B illustrate another optimization result of the modified taper design. In an aspect of the present disclosure, the source impedance may be varied. By way of example, the source impedance may change from 25 Ohm+/−10% (22.5 Ohm to 27.5 Ohm) and the length of the flex circuit is also reduced from 2.73 mm to 2 mm of each segment.

Figure 15B:
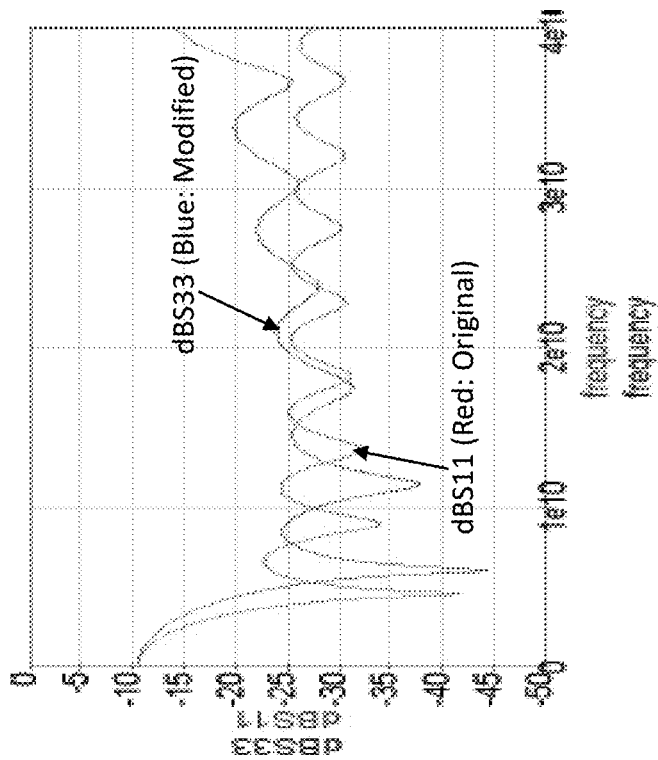
FIGS. 15A and 15B illustrate output responses of an example embodiment in an aspect of the present disclosure.
Figure 15A:
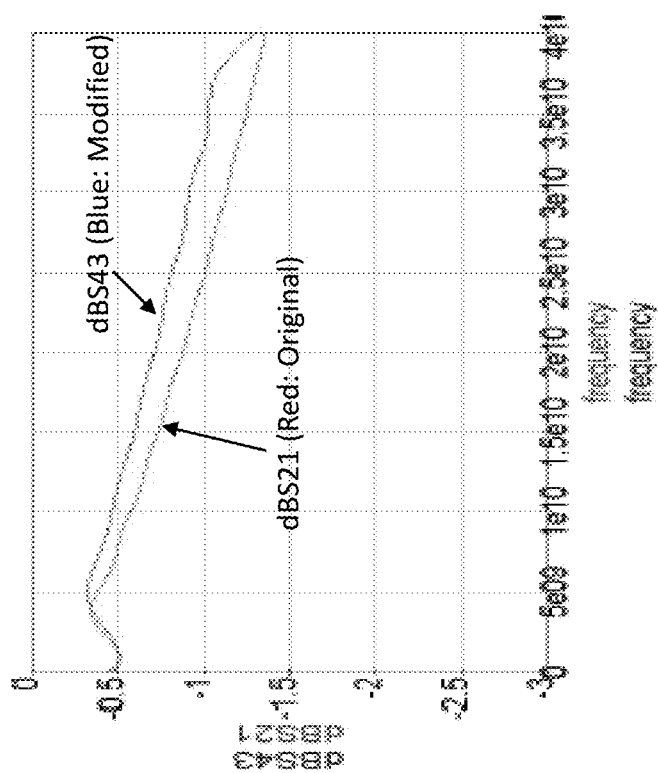

FIG. 15A and FIG. 15B illustrate another optimization result of the modified taper design. In an aspect of the present disclosure, both the source impedance and the load impedance are changed. By way of example, the source impedance is set to 22.5 Ohm and the load impedance is set to 12 Ohm. The length of the flex circuit may be reduced from 2.73 mm to 2 mm of each segment.

Figure 16A:
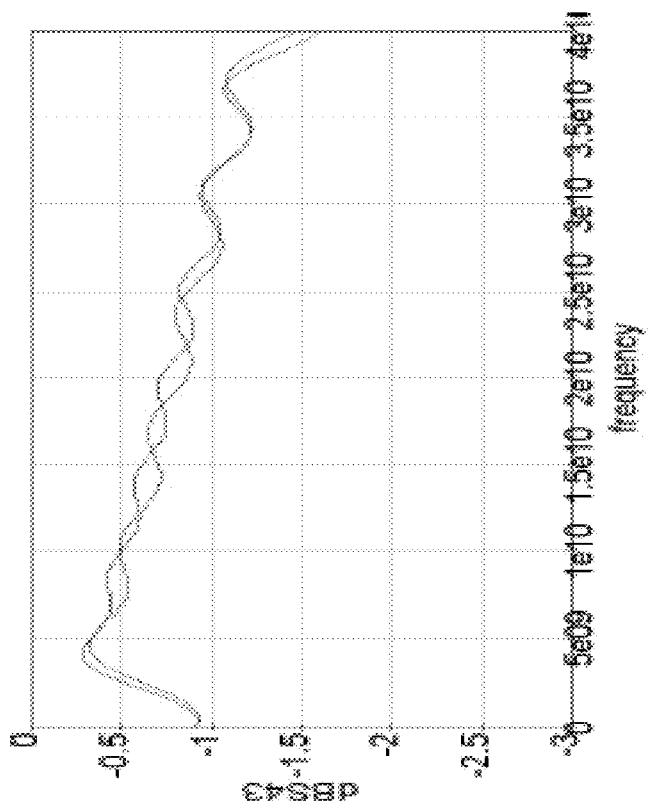
FIGS. 16A and 16B illustrate output responses of an example embodiment in an aspect of the present disclosure.
Figure 16B:
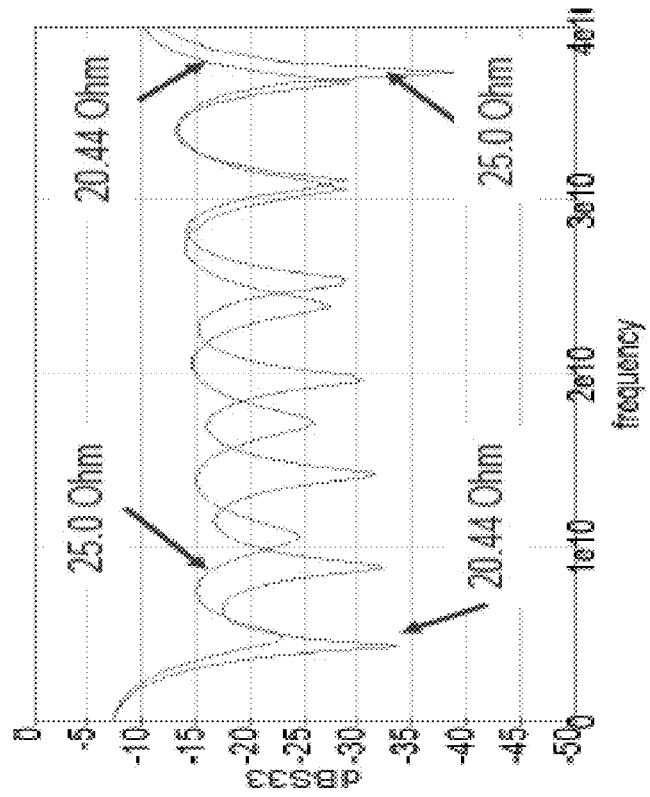

FIG. 16A and FIG. 16B illustrate another optimization result of the modified taper design. In an aspect of the present disclosure, the PWB line impedance is changed from 20.44 Ohm to 25 Ohm and the length of the flex circuit is also reduced from 2.73 mm to 2 mm of each segment. Also, it is noted that even if the line impedance of PWB may be made as 25 Ohm as a usual design, the overall performance has not been affected much.

Figure 17B:
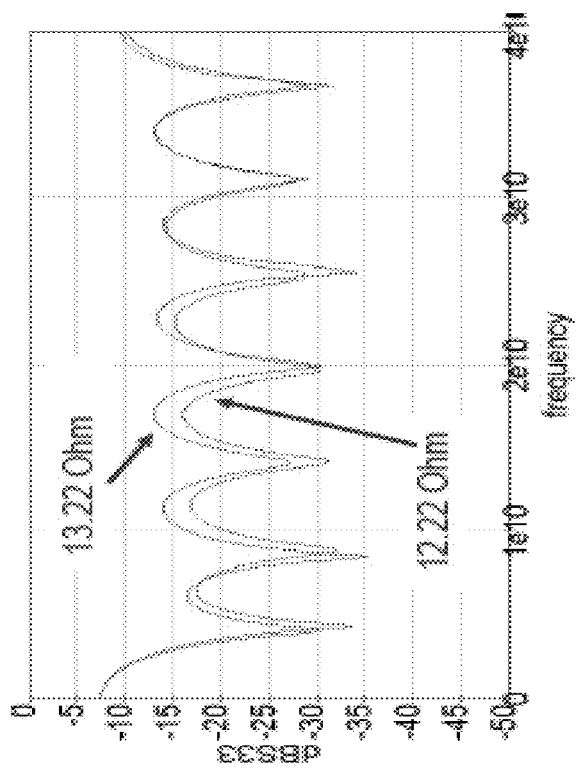
FIGS. 17A and 17B illustrate output responses of an example embodiment in an aspect of the present disclosure.
Figure 17A:
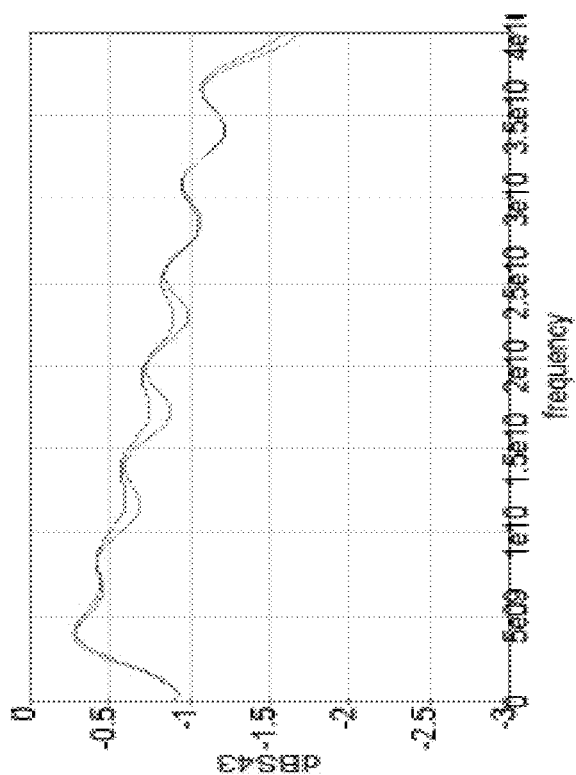

FIG. 17A and FIG. 17B illustrate another optimization result of the modified taper design. In an aspect of the present disclosure, the impedance of TO and submount may be changed from 12.22 Ohm to 13.22 Ohm. 13.22 Ohm is the impedance of the last section of the flex circuit. The length of the flex circuit may be reduced from 2.73 mm to 2 mm of each segment. In the example, even if the impedance of TO and submount is slightly increased to the same value of the impedance of the last section of the flex circuit, the overall performance has not been affected much.

Figure 18B:
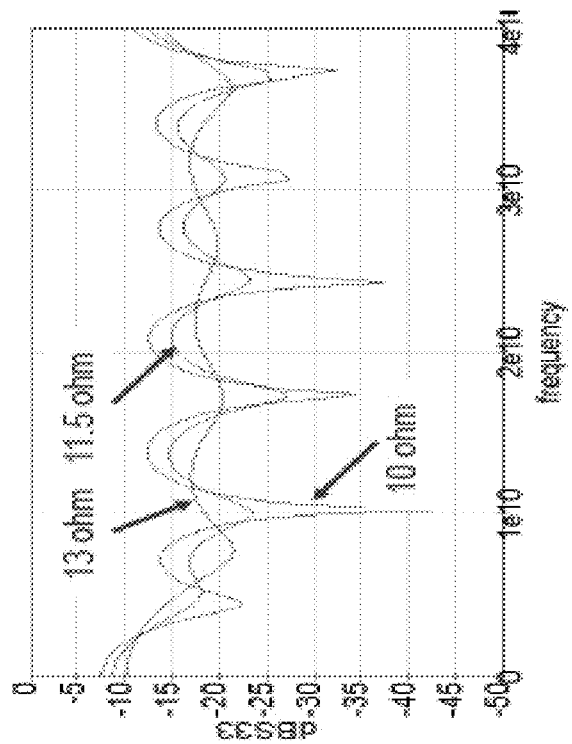
FIGS. 18A and 18B illustrate output responses of an example embodiment in an aspect of the present disclosure.
Figure 18A:
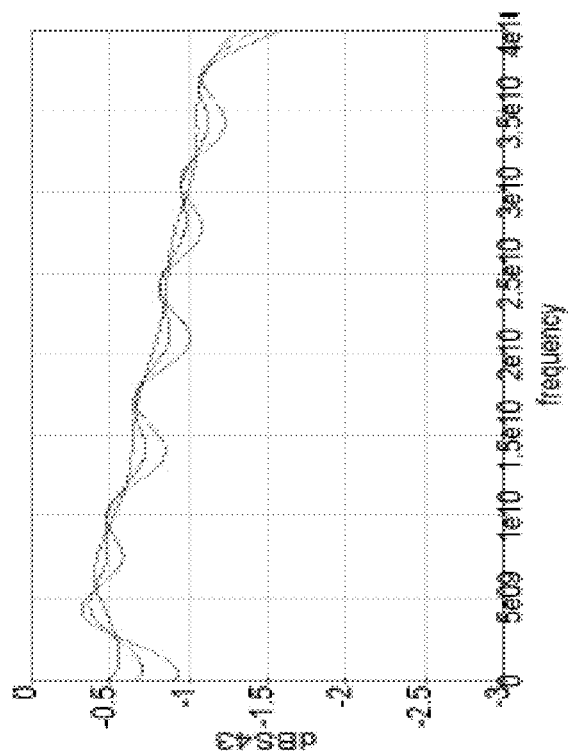

FIG. 18A and FIG. 18B illustrate another optimization result of the modified taper design. In an aspect of the present disclosure, in the example, the impedance of TO and submount may be set to 13.22 Ohm. PWB impedance may also be set to 25 Ohm. The load impedance may also be changed from 10 Ohm to 13 Ohm. The length of the flex circuit may be reduced from 2.73 mm to 2 mm of each segment. It is noted that overall S21 performance is well maintained even if the impedance of TO and submount is slightly increased and the PWB impedance is set to 25 Ohm. It is further noted that when the load impedance is 13 Ohm, S43 and S33 responses show the best performance. Also, it is noted that in the example 10 Ohm load shows the worst performance because the impedance of TO plus submount is increased.

In various aspects of the present disclosure, in one example, a better impedance matching of a DML package matching at 25 Ohm has been demonstrated based on the implementation of a taper design between components. As a result, the overall performance of an optical device or equipment incorporating the DML package and the taper design has shown to have improved significantly even with some variations of source impedance, load impedance and TO/submount impedance. It is also noted that slightly reduced source impedance and slightly increased load impedance may result in a better impedance matching too.

Further, in another aspect of the present disclosure, the taper may be designed and implemented for higher performance from PWB to DML. In another aspect of the present disclosure, the PWB and TO and submount impedance may be fixed to a value, and even with some variations of PWB and TO and submount, the overall performance may not be significantly affected. Also, the flex may be designed with one or more modified taper designs, which leads to easier implementation.

As such, the present disclosure provides a new novel taper design and applications thereof for impedance matching between various components in an optical device or equipment. By way of example, different impedance of a DML and a DML driver in a TO package may be effectively matched, thereby improving the performance of the DML packaged in TO and the overall performance of an optical communication device, system or equipment including thereof.

Further, as a result, the implementation of the present technology may lead to numerous benefits including a better matched design, improved performance, a lower driving voltage and less power consumption, reduced reflection, reduced radio frequency radiation, etc.

As shown above, various methods, techniques, arrangements or their variants may be implemented for matching different impedance values using a design and implementation of a tapered transmission line in an optical device or equipment. Other embodiments of the present technology may also be possible and are not limited to the disclosed embodiments herein.

In the present disclosure, a singular form may include a plural form if there is no clearly opposite meaning in the context. Also, as used herein, the article "a" is intended to include one or more items. Further, no element, act, step, or instruction used in the present disclosure should be construed as critical or essential to the present disclosure unless explicitly described as such in the present disclosure. As used herein, except explicitly noted otherwise, the term "comprise" and variations of the term, such as "comprising," "comprises," and "comprised" are not intended to exclude other additives, components, integers or steps. The terms "first," "second," and so forth used herein may be used to describe various components, but the components are not limited by the above terms. The above terms are used only to discriminate one component from other components, without departing from the scope of the present disclosure. Also, the term "and/or" as used herein includes a combination of a plurality of associated items or any item of the plurality of associated items. Further, it is noted that when it is described that an element is "coupled" or "connected" to another element, the element may be directly coupled or directly connected to the other element, or the element may be coupled or connected to the other element through a third element. Also, the term "include" or "have" as used herein indicates that a feature, an operation, a component, a step, a number, a part or any combination thereof described herein is present. Further, the term "include" or "have" does not exclude a possibility of presence or addition of one or more other features, operations, components, steps, numbers, parts or combinations. Furthermore, the article "a" as used herein is intended to include one or more items. Moreover, no element, act, step, or instructions used in the present disclosure should be construed as critical or essential to the present disclosure unless explicitly described as such in the present disclosure.

Although the present technology has been illustrated with specific examples described herein for purposes of describing example embodiments, it is appreciated by one skilled in the relevant art that a wide variety of alternate and/or equivalent implementations may be substituted for the specific examples shown and described without departing from the scope of the present disclosure. As such, the present disclosure is intended to cover any adaptations or variations of the examples and/or embodiments shown and described herein, without departing from the spirit and the technical scope of the present disclosure.

What is claimed is:

1. An optical communication device comprising:
   a directly modulated laser (DML) disposed in a package,
   a DML driver integrated circuit (IC) coupled to the DML, and
   a taper disposed between the DML driver IC and the DML, the taper coupling the DML driver IC and the DML disposed inside the package,
   wherein the taper is configured to match different impedance values of the DML driver IC and the DML disposed inside the package, minimizing an amount of impedance mismatch between a first impedance value of the DML and a second impedance value of the DML driver IC, and
   wherein the taper comprises a first section, a second section and a third section, the first section being allocated to a driver to a flex joint on a printed circuit board (PCB), the second section being allocated to a flex circuit, and the third section being allocated to the package which comprises a transistor outline (TO), a ceramic box, a Consortium on board optics (COBO), or a chip on board (COB) package.

2. The optical communication device of claim 1, wherein the first impedance value of the DML is about 10 Ohm and the second impedance value of the DML driver IC is about 25 Ohm.

3. The optical communication device of claim 1, wherein the package is the TO package and the third section of the taper is allocated to the TO and submount.

4. The optical communication device of claim 3, wherein the first section comprises a first set of three segments, the second section comprises a second set of fifteen segments, and the third section comprises a third set of three segments.

5. The optical communication device of claim 4, wherein the impedance of the first section and the impedance of the third section are approximated or determined as average values of three segments of each section, respectively.

* * * * *